United States Patent [19]
Grau et al.

[11] 4,104,109
[45] Aug. 1, 1978

[54] APPARATUS FOR BONDING ELECTRICAL CONTACTS TO PRINTED WIRING CIRCUIT BOARDS

[75] Inventors: Thomas George Grau, Westerville; David Elliott Tompsett, Lancaster, both of Ohio

[73] Assignee: Bell Telephone Laboratories, Incorporated, Murray Hill, N.J.

[21] Appl. No.: 828,513

[22] Filed: Aug. 29, 1977

[51] Int. Cl.$^2$ ...................... B32B 31/00; B65C 11/04
[52] U.S. Cl. .................................... 156/521; 156/578
[58] Field of Search ............................... 156/518–521, 156/578

[56] References Cited
U.S. PATENT DOCUMENTS

| 1,973,101 | 9/1934 | Ready | 156/233 |
| 2,969,300 | 1/1961 | Franz | 156/233 |

Primary Examiner—Douglas J. Drummond
Attorney, Agent, or Firm—William H. Kamstra

[57] ABSTRACT

Apparatus for the bonding of electrical precious metal contacts to the conductor terminations of printed wiring circuit boards. Featured is a rotatable wheel mechanism which, while it is loaded with a contact stock segment at one point on its periphery, at the same time deposits and bonds a previously loaded contact segment to a printed wiring board at an opposite point on its periphery. The wheel incorporates an internally mounted, radially aligned plunger having a magnet at each of its outer ends. With the plunger aligned vertically, the wheel is loaded at the top from a reel-fed supply of contact stock, a segment of which is sheared off by a downward movement of a punch blade which also deposits the severed contact segment on the upper magnet where it is retained by magnetic flux acting on a nickel layer of the segment. The punch continues its downward travel to deposit a previously loaded segment retained by the lower magnet to its ultimate location on the wiring board. Upon the restoration of the punch and blade, the wheel is rotated 180° to repeat the loading-bonding cycle.

17 Claims, 5 Drawing Figures

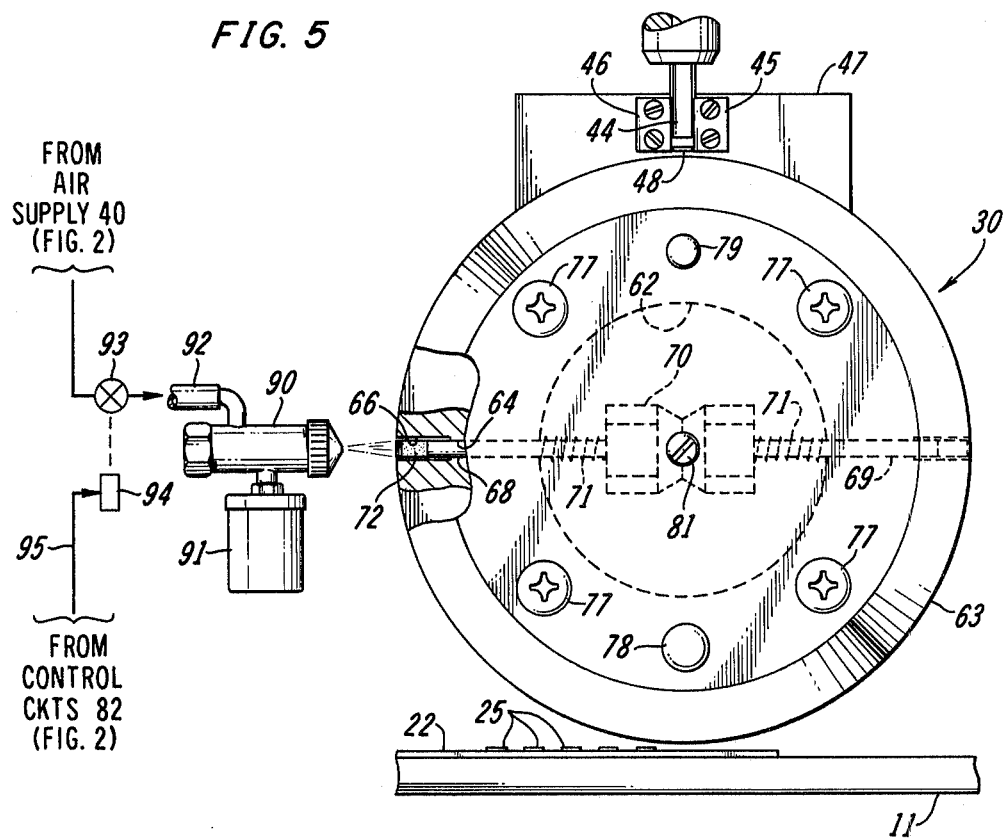

APPARATUS FOR BONDING ELECTRICAL CONTACTS TO PRINTED WIRING CIRCUIT BOARDS

BACKGROUND OF THE INVENTION

This invention relates to electrical printed wiring circuit boards and more particularly to apparatus for their fabrication.

Printed wiring circuit boards have long been known in the art as providing a highly advantageous means for organizing and supporting electrical conductors and circuit components. Such boards are typically formed as an epoxy glass laminate and have wiring printed thereon by a number of known methods in patterns as dictated by circuit functions. In many cases, the boards are mounted in edge connectors which also provide electrical interconnections with terminations of the wiring carried on the board. The connectors generally provide spring-type contacts between the fingers of which the board is inserted, the connector contacts making separable connection with corresponding terminations of the board wiring. These connections are not directly made with the copper printed conductors themselves, however. In order to ensure a low resistance connection which is also wear resistant, the conductor terminations are provided with gold-plated contact surfaces. Such gold platings at the contact areas of the conductors may be affixed thereon by a number of known methods, each of which involves a loosely controlled and time-consuming process including cleaning and preparing the copper surface and other manual steps. Further, at present, the plating takes place during the formation of the printed conductors themselves. As a result, the plated contact surfaces must be protected against all of the hazards of circuit board assembly. The plated surfaces are thus subject to possible abrasion, warping, solder contamination, and the like. Any defects in the precious metal plating may require the rejection of a circuit board when the remainder of the board circuitry is acceptable. Conversely, acceptable contact platings may be lost when other parts of the board prove defective.

It is accordingly one object of this invention to facilitate and reduce the cost of applying precious metal contact surfaces to printed wiring circuit boards.

Another object of this invention is to provide new and novel apparatus adapted for the application of precious metal contact surfaces to printed wiring circuit boards.

It is also an object of this invention to provide apparatus as characterized in the foregoing which may be automatically controlled to reduce to a minimum the number of manual steps required in the contact surface application operation.

A further object of this invention is to ensure the quality of precious metal contact surfaces of printed wiring circuit boards.

SUMMARY OF THE INVENTION

The foregoing and other objects of this invention are realized in one specific embodiment thereof comprising apparatus controlled to apply gold surface contacts to the surface of a printed wiring board at its conductor terminations in successive four-step cycles of operation. Central to the operation is a "wheel" assembly having an oppositely directed, radially moveable, plunger having a permanent magnet affixed at each of its outer ends. Previously prepared contact stock in the form of a multilayer foil is stored on a reel and is fed in predetermined segments to protrude between an upper one of the magnets and an air cylinder operated punch blade. The wheel assembly is loaded with a segment of contact stock when the air cylinder is operated, driving the punch blade downward, thereby simultaneously shearing the contact segment and depositing it on the upper surface of the upper magnet. The segment is there maintained with its gold surface downward by magnetic flux operating on a nickel layer of the foil. The wheel assembly is now rotated 180°, bringing the upper magnet and its contact segment in the lower position, the contact segment now having its gold surface facing upward in position for its deposit on a wiring board.

In the meantime, a wiring board is positioned by a work table with the first of a plurality of conductor termination positions located directly beneath the contact segment. At this time the loading operation as briefly described in the foregoing is repeated. The punch blade continues its travel downward thereby depositing the previously loaded contact on the wiring board to which a suitable adhesive has priorly been applied. The segment overlaps the conductor path termination to which it is reflow soldered in a subsequent assembly operation, which operation is outside of the scope of the present invention. The punch blade is maintained in its downward position, holding the deposited segment to the board for an interval sufficient for the adhesive to set. At this time the punch blade and plunger are restored to their normal positions in preparation for a second cycle of operation. In further preparation, the work table which is laterally moveable in increments corresponding to the spacings of the wiring board conductor terminations, is advanced one such increment to position a second termination beneath a magnet holding a contact segment thereabove. The four steps of the bonding cycle — the positioning of the wiring board, the shearing of the contact stock, the loading of a contact segment, and its application to the board — are successively repeated for the conductor terminations until the contact bonding operation is completed.

Advantageously, according to one feature of this invention, three of the steps of an operative cycle are thus accomplished virtually simultaneously. As a result of a single downward movement of the air cylinder punch blade, a segment of contact stock is severed and deposited on a retaining magnet and a previously loaded segment is applied to a wiring board.

According to another feature of this invention, each of the operative steps of the bonding apparatus is adapted for automatic control. Each of the steps other than the operation of the air cylinder, is accomplished by an electric motor which in a known manner may be controlled for incremental rotation to achieve the successive movements of the apparatus components as briefly described in the foregoing. Well-known minicomputer means are readily adapted for this overall control as well as the control of successive operations of the air cylinder by solenoid-actuated valves, for example. Such computer control makes for a highly flexible operation of a bonding apparatus according to the invention. The lateral movement of the work table, for example, may be programmed to position a wiring board for the bonding of contacts only on selected conductor terminations as dictated by circuit requirements. Similarly, in an alternate embodiment, the wheel assembly may be controlled to rotate in angular increments to provide for an intermediate stop between loading and bonding stops at which intermediate point an adhesive is applied to the underside of a contact segment rather than to the surface of the wiring board.

An important aspect of this invention is thus the fact that the production of the plated contacts is completely disassociated from the production of the wiring board conductors. This separation of technology has a number of advantages. A wider range of materials, for example, is available for the production of the contacts since the copper of the wiring board conductors now need not comprise one of its layers. Secondly, since the restrictions on the production of the contacts are more severe than those for the conductor paths, the production of both contacts and boards is facilitated and is less costly. Further, since the contacts are bonded on a wiring board during the final stage of its assembly, less care need be exercised for the protection of contact surfaces.

BRIEF DESCRIPTION OF THE DRAWING

The foregoing and other objects and the features of this invention will be better understood from a consideration of the detailed description of the organization and operation of one specific illustrative embodiment thereof which follows when taken in conjunction with the accompanying drawing in which:

FIG. 5 is a front and enlarged view of an alternate subassembly which may be substituted for the subassembly of FIG. 3 to add an adhesive application step to the operation of a contact bonding apparatus of the invention.

DETAILED DESCRIPTION

Figure 1:
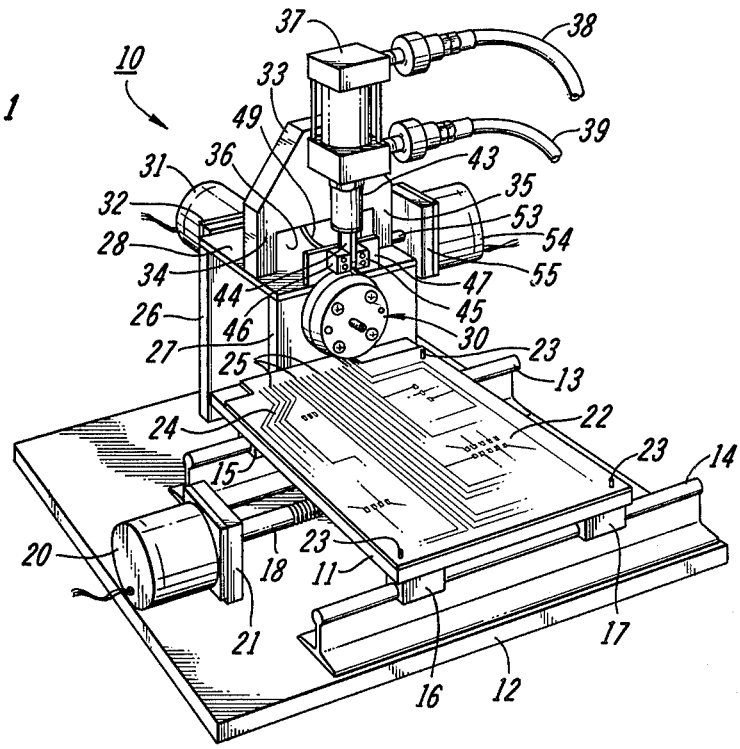
FIG. 1 depicts in perspective, a general view of one illustrative contact bonding apparatus according to this invention showing the relative disposition of its parts.
Figure 2:
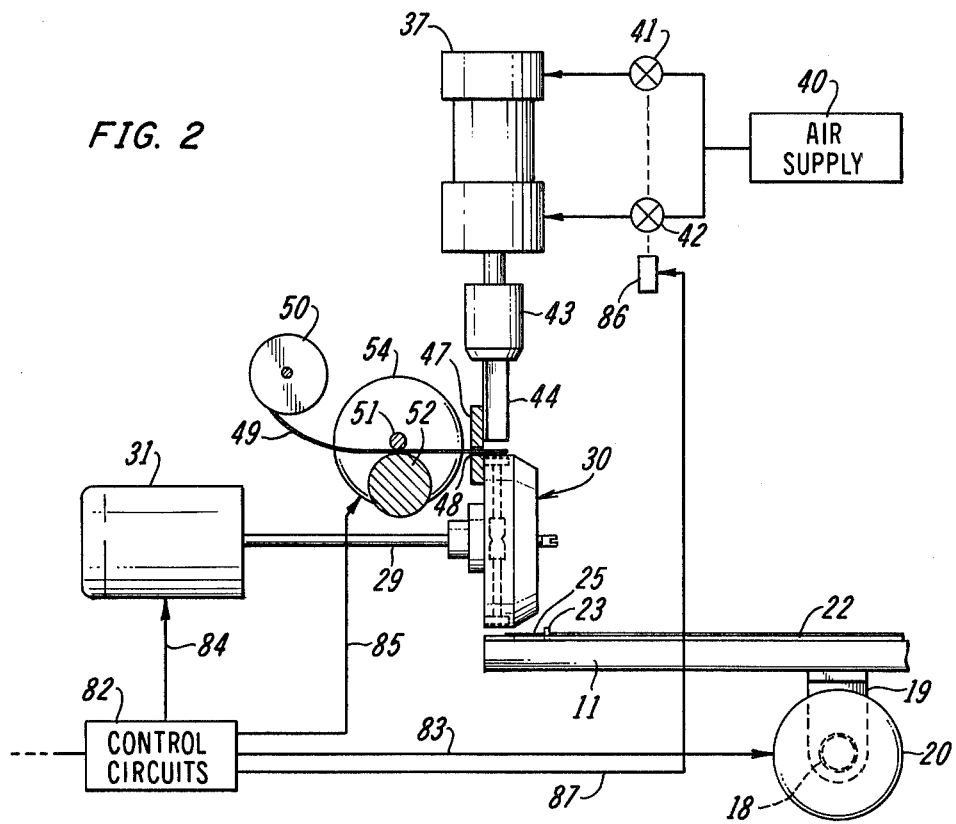
FIG. 2 is a simplified and partially schematic sideview of the apparatus of FIG. 1 showing more clearly operative components not visible in the latter figure.

One illustrative contact bonding apparatus according to this invention is shown in perspective in FIG. 1 and more directly in FIG. 2 and may be considered as comprising two subassemblies: the actual bonding mechanism 10 and a work positioning table 11. Both subassemblies are supported on a base plate 12, table 11 being moveably mounted thereon by means of a pair of rails 13 and 14 which themselves are parallelly mounted on plate 12 in any convenient manner. Table 11 is laterally displaceable along the axes of rails 13 and 14, riding thereon by means of riders mounted on the underside of table 11, riders 15, 16, and 17 being visible in FIG. 1. The riders are formed to present channels adapted to conform to the cross-sections of rails 13 and 14 in a precision slip fit, permitting an accurate lateral movement of table 11. This lateral movement is accomplished by a screw 18 operating in a fixed gear 19 also mounted on the underside of table 11 as shown in FIG. 2. Screw 18 is in turn driven by a motor 20 secured to base plate 12 by means of a mounting 21. A sample printed wiring board 22 conventionally comprising an epoxy glass laminate is shown in place on work table 11, the board 22 being accurately maintained in position by pins 23 extending from the upper surface of table 11 through apertures in board 22. Affixed to the upper surface of board 22 is an array of printed wiring comprising an exemplary pattern of conductors 24. Conductors 24 may typically be arranged in any pattern in accordance with wiring board circuit functions in a known manner; however, conductors 24 are extended to terminate short of the far edge of board 22, as viewed in the drawing, in a plurality of equally spaced, parallel terminations 25.

Bonding mechanism 10 is mounted on a tower comprising a pair of spaced-apart uprights 26 and 27 affixed to base plate 12 having a shelf 28 retained thereacross. Extending through apertures in uprights 26 and 27, not visible in FIG. 1, is a shaft 29 (FIG. 2) on the near end of which is rigidly mounted a bonding wheel 30, the details of which will be considered hereinafter in connection with FIGS. 3 and 4. Shaft 29 is rotatable in suitable bearings provided therefor in the upright apertures by means of a second motor 31 which is mounted on the rear of upright 26 by suitable mounting means 32. Completing the tower structure is a third upright 33 mounted on the shelf 28 by means of a pair of legs 34 and 35 presenting a slot 36 therebetween. On the forward surface of upright 33 is mounted an air cylinder 37 driven via a pair of lines 38 and 39 fron an air supply, not shown in FIG. 1 and only schematically as block 40 in FIG. 2, under the control of a pair of valves 41 and 42 also shown only symbolically in FIG. 2. The latter valves are solenoid controlled as will be further considered hereinafter. Air cylinder 37 is arranged to drive a punch 43 having provided on its end a blade 44 operating in a slot presented between a pair of guide blocks 45 and 46. The latter blocks are affixed by means of screws to a retaining plate 47 mounted on shelf 28 just forward of slot 36. As more clearly shown in FIG. 2, plate 47 is provided with a small slot 48 dimensioned to have passed therethrough a strip 49 of contact stock. Strip 49, to be described in greater detail hereinafter, is stored on a reel 50 (FIG. 2) and frictionally passes between a pair of rollers 51 and 52. Roller 51 is mounted on a shaft 53 driven by a third motor 54 which is mounted on the tower structure in any convenient manner such as by mounting means 55. It may be mentioned at this point that the mountings and relative positioning of the components so far described may be accomplished by suitable structure and means readily envisioned by one skilled in the art. Accordingly, such mountings not visible in FIG. 1 are omitted from the partially schematic view of FIG. 2 as unnecessary for a complete understanding of the invention.

An important element of a bonding apparatus according to this invention is the bonding wheel 30 mentioned only briefly hereinbefore. Wheel 30 is shown enlarged and in greater detail in FIGS. 3 and 4 and comprises a hub 60 having a hole 61 drilled therein dimensioned for press fit about shaft 29 previously referred to. As shown in cross-section in FIG. 4, hub 60 has a concentric cavity 62 formed therein which in turn forms an outer rim 63. Rim 63 has radially bored therethrough a pair of diametrically opposed holes 64 and 65. At the outer ends of each of the holes 64 and 65, rim 63 has provided therein a pair of slots 66 and 67 parallel to the axis of hub 60 and centered on the axes of holes 64 and 65. A pair of plunger pins 68 and 69 are slip fitted in holes 64 and 65, respectively, and are fitted at one end in a stop 70 inside cavity 62. Stop 70 is maintained in position by a pair of springs 71 encircling plunger pins 68 and 69, held in compression between shoulders of stop 70 and the periphery of cavity 62. At the opposite ends, plunger pins 68 and 69 have mounted thereon rectangular block magnets 72 and 73, respectively, which magnets are dimensioned for slip fit in the slots 66 and 67. The vertical dimensions of the latter slots are greater than the corresponding dimensions of magnets 72 and 73 in order to permit radial movement of the magnets in the slots for purposes which will be described. The outer surface magnets 72 are flat with, however, a small offset 74 being provided at the right sides as viewed in the FIG. 4 for reasons which will also become apparent hereinafter. The open face of wheel assembly 30 is covered by a cover plate 75 shown partially broken away in FIG. 3. Plate 75 is seated in an annular inset 76 of rim 63 and is retained thereon by suitable means such as screws, two screws 77 of which are visible in FIG. 3. To ensure accurate positioning plate 75 is located on the wheel assembly 30 by means of different diameter pins 78 and 79 retained on rim 63 and passing through locating holes provided in plate 75. The location of the latter plate is important in view of its second function of retaining a centering means for plungers 68 and 69. The centering means comprises a pin 80 having a rounded end extending from a hole drilled along the axis of a set screw 81. Stop 70 is grooved at its center to form an annular "V" slot within which pin 80 is urged by a coil spring 82 acting against the other end of pin 80 within the drilled hole of set screw 81. Plunger pins 68 and 69 are thus maintained in radial positions so that the flat outer surfaces of magnets 72 and 73 are held just within the outer periphery of rim 63.

Control of the apparatus so far described in performing successive operations to be considered hereinafter may be accomplished by means of circuitry readily envisioned by one skilled in the art. Thus, the actuation of motors 20, 31, and 54 may be controlled and power therefor supplied by circuitry represented symbolically in FIG. 2 and designated control circuits 82, via leads 83, 84 and 85, respectively. Similarly, control circuits 82 provide control for a solenoid 86 via lead 87, which solenoid in turn controls the operation of valves 41 and 42. Control circuits 82 may comprise, for example, well known mini-computer means for program directing its control function. Accordingly, circuits 82 need not be described in detail beyond setting forth the functions to be performed thereby for a complete understanding of the invention and its features.

Figure 3:
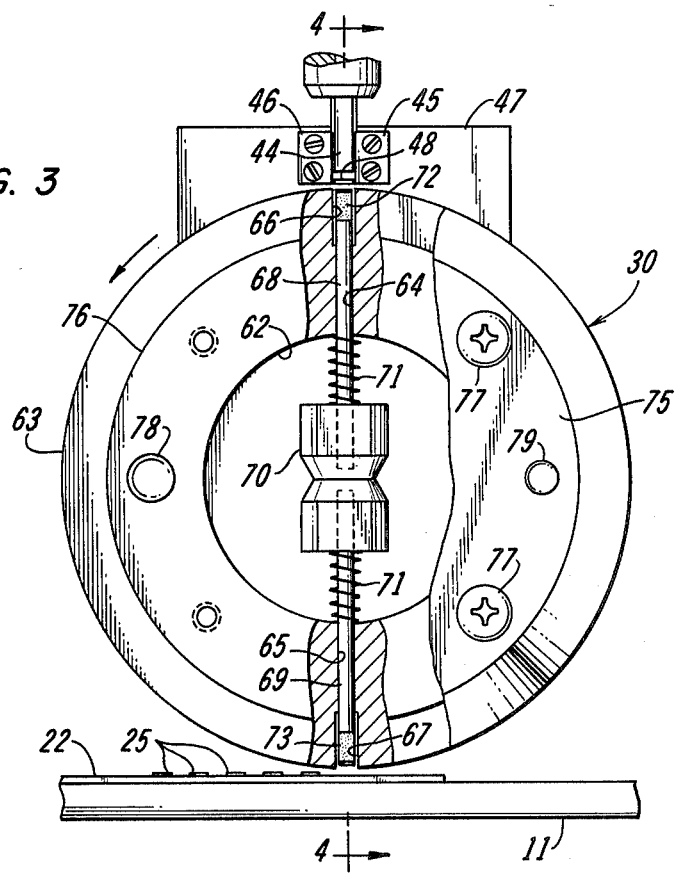
FIG. 3 is a front and enlarged view of a subassembly of the apparatus of FIG. 1 which actually accomplishes the novel bonding operation of the invention, portions of the subassembly being shown broken away to reveal its operative parts.
Figure 4:
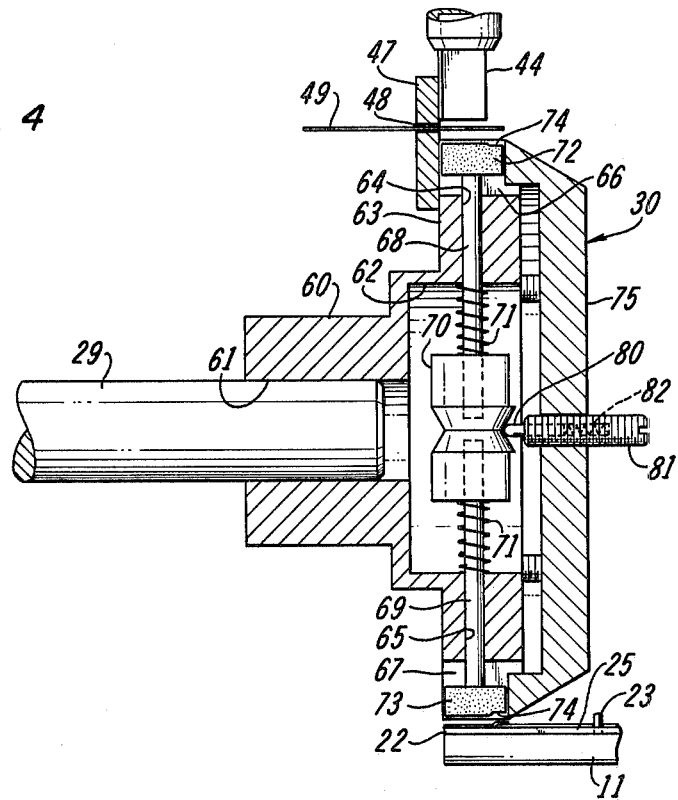
FIG. 4 is a cross-section view of the subassembly of FIG. 3 taken along the line 4—4.

With the organization of an illustrative bonding apparatus according to this invention as described in the foregoing in mind, an exemplary cycle of operation thereof may now be considered. In preparation for the bonding operation, a typical printed wiring board 22 is assumed as having been positioned on table 11 by means of pins 23 previously described. The board 22 itself has been priorly prepared by the application of a suitable adhesive to the portion of the board extending beyond conductor terminations 25 (FIG. 1). Any suitable commercially available adhesive may be employed for this purpose, the only specification being that it retain its adhesive qualities during a short exposure to air. With board 22 thus in place, the apparatus of this invention may now be controlled to deposit and bond a contact at a first of the terminations 25. Advantageously, according to one feature of this invention, a single cycle of operation comprises the loading of stock for one contact while at the same time a previously loaded contact is deposited at a termination 25 of board 22. A contact bonding operation is accordingly begun by loading a segment of contact stock in preparation for its subsequent deposit on board 22. Motor 20, which is controlled by control circuits 82 to move table 11 along rails 13 and 14 in increments equal to the spacings of conductor terminations 25, accordingly positions, by means of screw 18, board 22 so that magnet 73 is in vertical alignment with a point on board 22 one such spacing ahead of the first termination 25 (FIG. 3).

Motor 54 is controlled, also by control circuits 82 via lead 85, to advance by means of friction rollers 51 and 52 from reel 50 a short segment of strip 49 through slot 48 to protrude therefrom under and in alignment with blade 44. Strip 49 comprises the stock from which the contact segments are cut in measured lengths in a manner to be described and typically may comprise a multilayer foil having an upper layer of gold plated on a layer of nickel which in turn is plated on a base layer of copper. The underside of the foil, i.e., the underside of the layer of copper, is solder plated. For reasons which will appear hereinafter, contact strip 49 is stored on reel 50 and is fed through slot 48 inverted from its orientation ultimately assumed on a wiring board. Motor 54 is incrementally controlled by circuits 82 to move lengths of strip 49 sufficient to extend from the outer end of board 22 to overlap with an end of a termination 25. It may be noted at this point that motor 54 may be controlled to feed contact stock segments of any length as may be required for particular wiring board dimensions. At this time, again under the control of control circuits 82, solenoid 86 is actuated via lead 87 to operate valves 41 and 42. Typically, valve 42 is normally open and valve 41 closed, air pressure from supply 40 accordingly maintaining punch 43 in its raised position. When solenoid 86 is actuated, valve 41 is opened and valve 42 is closed with the result that punch 43 is forced downward, blade 44 acting as a shear against back plate 47 to sever the protruding segment of contact strip 49. Blade 44 continues in its downward movement to deposit the severed contact segment on the upper surface of magnet 72 where it is retained in place by magnetic flux acting on the nickel layer of the contact segment. Punch 43 and its blade 44 continue their downward travel to drive opposing plunger pins 68 and 69 against the compression of a spring 71 and the urging of locating pin 80 which continued downward movement in subsequent operations accomplishes the actual deposit of a contact segment at a termination 25.

Solenoid 42 is now again actuated under control of control circuits 82 to close valve 41 and open valve 42, thereby restoring punch 43 and its blade 44 to the raised position, the deposited contact segment being retained by magnet 72. As punch 43 is restored, plunger pins 68 and 69 are also restored to their radial positions under the urging of a spring 71 and are accurately located by locating pin 80. Motor 31 is controlled also by control circuits 82 to rotate wheel 30 counterclockwise in the embodiment being described in 180° increments, coming to rest after each half rotation with plunger pins 68 and 69 in vertical alignment with blade 44. This half rotation is now accomplished to reverse the positions of magnets 72 and 73. At the same time, motor 20 is incrementally controlled to advance table 11 and hence board 22 one termination spacing to the right as viewed in the drawing, thereby positioning magnet 72 and its retained contact segment in alignment with the end of the first termination 25 of board 22. At this time, motor 54 is controlled to advance another segment of strip 49 through slot 48 in a manner and to a position previously described. As also previously described, air cylinder 37 is controlled to drive punch 43 once again downward for blade 44 to sever the protruding contact segment. Blade 44 continues in its downward travel as before to deposit the severed contact strip segment, this time, on the upper surface of magnet 73. As plunger pins 68 and 69 are again urged downward against the compression of an active spring 71 and the action of locating pin 80, the contact segment being retained by the now lower magnet 72 is deposited in alignment with the end of the first termination 25 on the adhesive surface of board 22. The operation of air cylinder 37 is timed to hold blade 44 pressed to the deposited contact segment for a sufficient interval to permit the adhesive to set. At the end of that interval, air cylinder 37 is again controlled to restore blade 44 in the manner described, thereby again restoring magnets 72 and 73 to their radial positions in preparation for a second cycle of operation. The cycles of operation are repeated as described in the foregoing until the last of the terminations 25 (the foremost as viewed in FIG. 1) has a contact segment deposited on board 22 at its location. Control circuits 82 may be arranged to return table 11 to its initial start position after the deposit of the last contact segment after which board 22 may be removed from table 11.

At that time, board 22 may be further operated upon by fabrication steps not within the purview of this invention. Thus, for example and as mentioned hereinbefore, the contact segments are deposited on board 22 to overlap slightly with the ends of corresponding conductor terminations 25. For this reason, the outer surfaces of magnets 72 and 73 are slightly offset to ensure an even distribution of the downward force applied by a magnet 72 or 73 on the surface of a contact segment. After removal of a board 22 from table 11, it is contemplated that the overlap portions of the contact segments will be reflow soldered to the ends of terminations 25 in a known manner.

The flexibility of a contact bonding apparatus according to this invention under automatic control is further demonstrated by an alternate operation of the wheel assembly 30 as depicted in FIG. 5. In the illustrative embodiment of the invention described in the foregoing, wiring boards 22 were contemplated as having an adhesive applied thereon prior to their positioning on table 11. In an alternate arrangement, adhesive may be applied to the contact stock segments themselves at an intermediate stop position of wheel 30 between the two 180° separated positions described previously. In FIG. 5 is shown the wheel assembly 30 of FIG. 3, the same reference characters being employed to indicate identical elements. Added to the apparatus in the embodiment of FIG. 5 is an adhesive application assembly comprising an ejector mechanism 90 having provided therewith an adhesive reservoir 91. Ejector mechanism 90 may be typically operated by compressed air supplied from air supply 40 (FIG. 2) via line 92 under the control of a valve 93. Valve 93 may be operated by means of a solenoid 94 also energizable via a lead 95 by control circuits 82 (FIG. 2).

The control and operation of the wheel assembly of FIG. 5 differs from the embodiment previously described only in that an intermediate stop is introduced in its rotation 90° counterclockwise from its normal vertical operative position. Such an additional incremental rotation is readily accomplished as an added function of control circuits 82. As shown in FIG. 5, at this position, the normally underside of a contact stock segment retained by magnet 72 is in alignment with and exposed to ejector mechanism 90. At this time, as an intermediate operative step, solenoid 94 is energized via lead 95 by control circuits 82 as a further function thereof to open normally closed valve 93. As a result of the applied compressed air, ejector mechanism 90 directs a small quantity of adhesive which is deposited on the exposed surface of the contact stock segment retained by magnet 72. When solenoid 94 is de-energized, valve 93 again closes and wheel assembly 30 is rotated an additional 90 degrees, again under control of circuits 82 (FIG. 2), to position magnet 72 and its retained contact segment above a conductor termination 25 at which point the segment is applied to a board 22 in the manner as described in detail in the foregoing. Although not specifically described or shown in the drawing, the mounting of the added adhesive application assembly to, say upright 27 (FIG. 1), is accomplished by any suitable mounting means readily envisioned by one skilled in the art. The alternate embodiment according to the principles of this invention as partially depicted in FIG. 5 advantageously eliminates the requirement of preapplying adhesive to a wiring board before a contact bonding operation.

Still other variations in the organization and operation of a contact bonding apparatus according to this invention will be evident to one skilled in the art. In the foregoing, it was demonstrated that wheel assembly 30 may be controlled to rotate in increments as required by particular operative steps. In a similar manner, table 11 may be moved in any lateral increments under control of circuits 82 to permit the application of contacts to only selected ones of the conductor terminations rather than to every termination of a wiring board. The wheel assembly 30 itself may be modified to provide multiple plunger and magnet pairs which when associated with multiple punch and blade sets, would permit the deposit and bonding of more than one contact segment simultaneously. Further, wheel assembly 30 is circular only for convenience of manufacture. Thus, it will be appreciated that the assembly need provide only so much structure as required to support plunger pins 68 and 69 and to provide for their rotation. For these purposes, for example, a simple rotatable backplate having oppositely disposed arm sections extending therefrom would be sufficient for accomplishing the objects of this invention.

Accordingly, what has been described are considered to be only specific illustrative contact bonding apparatus according to the principles of this invention, and it is to be understood that various and numerous other arrangements may be devised by one skilled in the art without departing from the spirit and scope of the invention as defined by the accompanying claims.

What is claimed is:

1. Apparatus for applying electrical contact segments to conductor terminations of a printed wiring circuit board comprising a table for supporting said circuit board, centrally pivotable and radially moveable plunger means arranged at right angles to the plane of said wiring board, contact segment retaining means mounted at opposite ends of said plunger means, one of said retaining means presenting a first contact segment opposite a first of said conductor terminations of said wiring board, loading means for feeding a second contact segment opposite the other of said retaining means, blade means suspended along the longitudinal axis of said plunger means and opposite said second contact segment, and means for driving said blade means along said axis for depositing said second contact segment on said other of said retaining means and for further driving said plunger means along said axis for applying said first contact segment on said wiring board at said first conductor termination.

2. Apparatus as claimed in claim 1 also comprising means for laterally moving said table and thereby said circuit board to position a second of said conductor terminations opposite said one of said retaining means and means for rotating said plunger means 180° for positioning said other of said retaining means and said second contact segment opposite said second of said conductor terminations.

3. Apparatus as claimed in claim 2 in which said loading means comprises a reel for storing a continuous length of contact stock and means for withdrawing lengths of said stock comprising said contact segments, said blade means also severing a contact segment from said stock as said blade means is driven along said longitudinal axis of said plunger means.

4. Apparatus as claimed in claim 3 in which said contact stock contains a magnetic flux responsive material and in which each of said contact retaining means comprises a magnet means.

5. Apparatus as claimed in claim 1 in which said circuit board has an adhesive applied to a surface thereof at said conductor terminations.

6. Apparatus as claimed in claim 1 also comprising adhesive ejector means, means for rotating said plunger means for positioning said other of said retaining means and said second contact segment opposite said ejector means, and means for controlling said ejector for depositing an adhesive on said second contact segment.

7. Apparatus for applying electrical contact segments to conductor terminations of a printed wiring circuit board comprising a table for supporting said circuit board, a rotatable member mounting a plunger means, said plunger means being radially moveable at right angles to the axis of rotation of said member, contact segment retaining means mounted at opposite ends of said plunger means, said plunger means being arranged at right angles to the surface of said table so that one of said retaining means is adjacent to said surface, loading means for feeding a contact segment opposite the other of said retaining means, blade means suspended along the longitudinal axis of said plunger means and opposite said other retaining means, drive means for driving said blade means along said longitudinal axis for depositing said contact segment on said other retaining means and for further driving said plunger means in the direction of said table to apply a contact segment retainable by said one retaining means to a circuit board supported by said table, and means for subsequently rotating said member 180° for positioning said one of said retaining means opposite said blade means and for positioning said other retaining means adjacent to said surface of said table.

8. Apparatus as claimed in claim 7 also comprising means for laterally moving said table in increments corresponding to particular spacings of said conductor terminations on said circuit board.

9. Apparatus as claimed in claim 8 in which said loading means comprises reel means for storing a continuous length of contact stock and means for withdrawing lengths of said stock to form said contact segments, said blade means also being adapted to sever a contact segment from said stock as said blade means is driven along said longitudinal axis of said plunger means.

10. Apparatus as claimed in claim 9 in which said contact stock includes a magnetic flux responsive material and in which each of said contact retaining means comprises a magnet means.

11. Apparatus for depositing strip stock segments on a surface of a work piece comprising a centrally pivoted, rotatable member presenting a backplate disposed at right angles to the axis of rotation of said member, said backplate having first and second oppositely disposed arm sections extending therefrom, said arm sections having holes formed therein along a common axis at right angles to said axis of rotation, plunger means slidable fitted in said holes, spring means between said arm sections for maintaining said plunger means in a normal position between said arm sections, retaining means at each of opposite ends of said plunger means for retaining strip stock segments, blade means positioned opposite one of said retaining means, and loading means for feeding strip stock segments between said blade means and said one of said retaining means, said blade means being moveable along said common axis when one of said stock segments is fed between said blade means and said one of said retaining means to deposit said one of said stock segments on said last-mentioned retaining means and for further moving said plunger means from said normal position against the action of said spring means when the other of said retaining means has a second stock segment retained thereon for depositing said last-mentioned segment on an adjacent work piece.

12. Apparatus as claimed in claim 11 also comprising means for rotating said member 180° when said plunger means is restored to said normal position for rotating said other of said retaining means opposite said blade means and said one of said retaining means adjacent a work piece.

13. Apparatus as claimed in claim 12 in which said loading means comprises reel means for storing continuous lengths of said strip stock and said blade means is adapted to sever a stock segment as said blade means is moved along said common axis.

14. Apparatus as claimed in claim 13 in which said strip stock contains a magnetic flux responsive material and each retaining means comprises a magnet means.

15. Apparatus as claimed in claim 14 in which said backplate of said rotatable member comprises a circular disc and said arm sections comprise opposing sections of an annular rim extending from said disc.

16. Apparatus for depositing strip stock segments on the surface of a work piece comprising a table for supporting a work piece, a rotatable member mounting a plunger means, said plunger means being radially moveable at right angles to the axis of rotation of said member in either direction from a normal position, stock segment retaining means mounted at opposite ends of said plunger means, said plunger means being arranged at right angles to the surface of said table so that one of said retaining means is adjacent said surface, reel means for storing a continuous length of said strip stock and for feeding a predetermined stock segment opposite the other of said retaining means, blade means suspended along the longitudinal axis of said plunger means and opposite said other retaining means, drive means for driving said blade means along said longitudinal axis for severing said stock segment and for depositing said stock segment on said other retaining means and for further driving said plunger means in the direction of said table to deposit a stock segment to said surface of said work piece when a stock segment is retained by said one retaining means, means for rotating said member 180° when said plunger means is restored to said normal position for positioning said one of said retaining means opposite said blade means and for positioning said other retaining means adjacent said surface of said table, and means for laterally moving said table for positioning a work piece supportable thereon opposite said other retaining means.

17. Apparatus as claimed in claim 16 in which said drive means comprises an air cylinder.

* * * * *